United States Patent [19]

Albert

[11] 4,388,848
[45] Jun. 21, 1983

[54] CUTTER RING AND METHOD OF MAKING SAME

[75] Inventor: Eugene V. Albert, Sedgwick County, Kans.

[73] Assignee: Q Corporation, Sedgwick County, Kans.

[21] Appl. No.: 260,055

[22] Filed: May 4, 1981

[51] Int. Cl.[3] .......................... B26D 1/14; B26D 7/26
[52] U.S. Cl. .................................. 83/666; 76/101 A; 83/676; 83/698
[58] Field of Search ........................ 83/666, 676, 698; 76/101 A, 101 R

[56] References Cited

U.S. PATENT DOCUMENTS 2,894,583  7/1959  Johnstad ........................... 83/676 X
3,306,149  2/1967  John ..................................... 83/676
4,170,156  10/1979  Kondo ............................ 83/666 X
4,253,360  3/1981  Zontelli ........................... 83/676 X Primary Examiner—Frank T. Yost
Attorney, Agent, or Firm—Kokjer, Kircher, Bradley, Wharton, Bowman & Johnson

[57] ABSTRACT

A cutter ring for use in trimming printed circuit board leads and a method of forming the ring is the subject of this invention. The cutter member is of annular configuration and is provided with a central hub portion surrounding an aperture. The cutter member itself is formed from a hardened sintered carbide which can only be shaped through a prolonged grinding operation. A molded cap is formed over the hub portion to present a surface which is to be received within a tool holder such as an arbor. The molded cap is characterized by being formed from a relatively soft workable material which can be shaped through a machining operation.

11 Claims, 5 Drawing Figures

CUTTER RING AND METHOD OF MAKING SAME

This invention relates to apparatus for trimming electrical component leads of circuit boards and, more particularly, to an improved cutter ring and a method of constructing same.

An apparatus specifically designed for trimming electrical component leads from printed circuit boards is disclosed in my prior U.S. Pat. No. 4,132,137, issued Jan. 2, 1979. This patent is incorporated herein by reference to the extent necessary to obtain a complete and full understanding of the present invention. The machine disclosed in the referenced patent provides for a plurality of rotary cutters which operate at speeds of 5,000 to 7,500 revolutions per minute. The cutters may be designed to travel in a horizontal plane relative to the printed circuit board or the board may be moved in a horizontal plane across the face of the cutters. Heretofore, the rotary cutters have been formed of sintered carbide which is exceedingly hard and holds a cutting edge for a relatively long period of time. A considerable amount of time is required, however, to grind the sintered carbide cutters so as to properly fit the tool holders which mount them. The cutter rings are held in an arbor which is coupled with a drive mechanism. Heretofore, it has been necessary to precisely grind the cutter ring so as to provide for close tolerances which will minimize the total indicator runout (T.I.R.). Not only is the grinding procedure time consuming and therefore costly, but the inherent nature of grinding results in a cutter ring which is generally compatible only with one particular tool holder and cannot readily be moved from one tool holder to another.

The present invention offers a number of advantages over the prior art by providing a rotary cutter wherein the cutter ring is formed from sintered carbide and then capped with a resinous material which can be machined rather than being ground. This permits the cutter ring to be conformed to the tool holder much more easily while also providing more reproducible results. The contact points for centering the ring within the holder are also moved outwardly away from the center so as to provide for greater accuracy with the same dimensional tolerances as would have been used with prior art constructions.

It is, therefore, a primary object of the present invention to provide a rotary cutter for trimming electrical leads and a method of making same wherein the cutter is formed with a cap of relatively soft easily workable material thus reducing the number of grinding operations required to form the cutter.

Another object of the invention is to provide a rotary cutter and method as set forth in the preceding object wherein the contact points for centering purposes between the cutter and the tool holder are moved outwardly away from the center where tolerances can be greater without increasing the total indicator runout.

It is also an important aim of the present invention to provide an improved cutter ring and method as set forth above wherein the cutter ring includes a safety ring which is imbedded within the cap of relatively workable material so as to prevent separation of the ring from the tool holder in the event of longitudinal cracks occurring in the face of the ring.

A further objective of the invention is to provide a cutter ring for use in trimming electrical component leads from printed circuit boards wherein the face of the cutter ring which mates with the tool holder is formed from a relatively soft machineable material thus providing greater uniformity in the mating faces between different cutters thereby accommodating transfer of the cutter rings from one tool holder to another.

It is also an object of this invention to provide a rotary cutter and method as described in the foregoing objects wherein the mating face of the cutter ring which is received by the tool holder is formed from a relatively soft workable material so as to accommodate a net press fit between the cutter and the holder.

Other objects of the invention will be made clear or become apparent from the following description and claims when read in light of the accompanying drawing, wherein:

Figure 1:
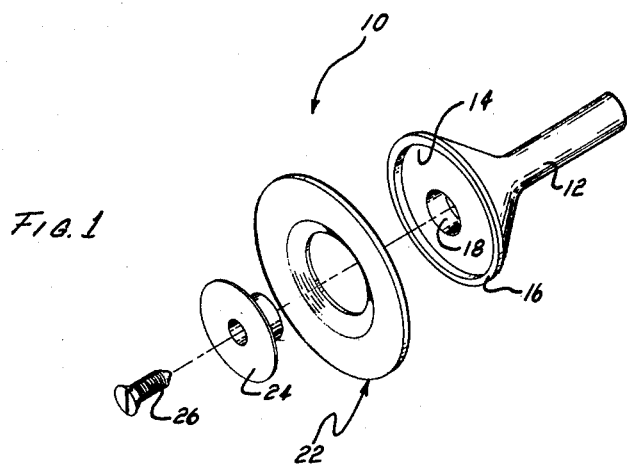
FIG. 1 is an exploded perspective view of the cutter assembly according to the present invention.
Figure 2:
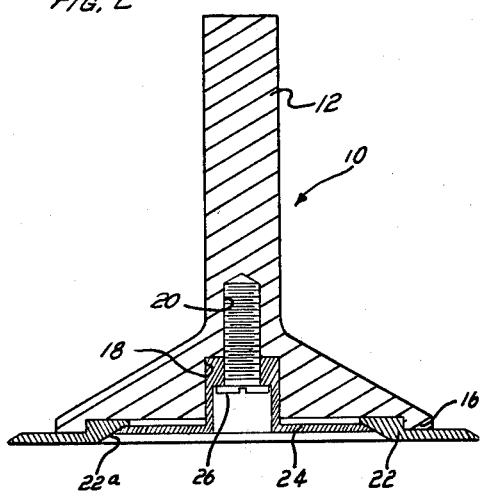
FIG. 2 is an enlarged vertical cross-sectional view of the cutter.

Referring initially to FIGS. 1 and 2, the cutter assembly of the present invention is designated generally by the numeral 10 and is of the type generally used in conjunction with apparatus for trimming electrical component leads from a printed circuit board as shown and described in U.S. Pat. No. 4,132,137. Cutter assembly 10 includes a tool holder in the form of an arbor 12 having a recessed face 14 with a peripheral rim 16. An opening 18 is recessed in the center of face 14 and communicates with a threaded bore 20 which extends up into the stem of arbor 12.

Figure 4:
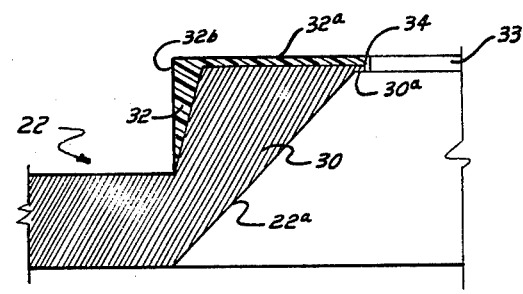
FIG. 4 is a fragmentary enlarged vertical cross-sectional view similar to FIG. 3 after the cap has been machined to the desired configuration.
Figure 3:
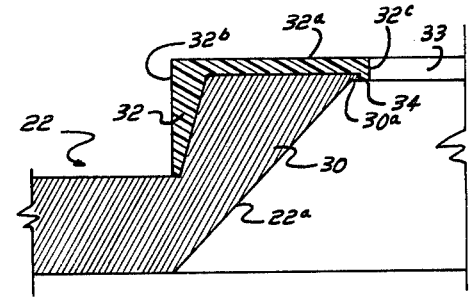
FIG. 3 is a further enlarged vertical cross-sectional view of a portion of the cutter ring illustrating the molded cap on the hub.
Figure 5:
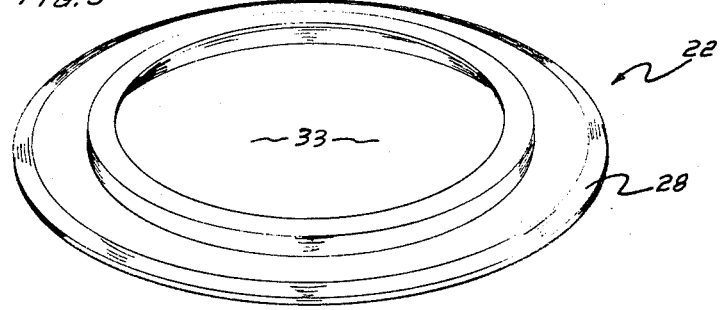
FIG. 5 is a perspective view of the cutter ring removed from the rest of the assembly.

The cutter assembly further includes a cutter ring 22 which is held in place by a retainer 24 and screw 26. Referring additionally now to FIGS. 3, 4 and 5, details of the cutter ring 22 will be described. The cutter ring is formed from a hardened material such as sintered carbide with a beveled cutting edge 28 ground into the outer edge. A raised hub 30 projects outwardly from the main body of the cutter ring. Hub 30 is integral with the rest of the cutting ring 22 and is formed from the same hardened sintered carbide. Hub 30 includes a cap 32 which extends across the top of the hub, down the sides and into an aperture 33 presented by ring 22.

It is to be noted that hub 30 includes a dished out portion 30a presented by a lip 34 which defines the central aperture of ring 22. It is important that cap 32 be formed from a relatively soft easily workable material, preferably one which can be molded in place on hub 30. Various resinous and metallic substances can be used for cap 32, although epoxy is a preferred material.

Cap 32 is molded onto hub 30 in the general configuration illustrated in FIG. 3. Since the cap is formed from a relatively soft easily workable material, it can be machined down, through use of a milling head or comparable tool, to the precise tolerances required so as to perfectly mate with face 14 of arbor 12. The flat horizontal surface 32a, the vertical outside surface 31b and the inner lip 32c are all machined to the precise tolerances required. The machined cap 32 is illustrated in FIG. 4. The machining capability of cap 32 is to be contrasted with the hardened sintered carbide of the main body of ring 22 which can only be worked through a tedious grinding process.

At this point, it is important to understand that in the prior art construction of cutting rings the sintered carbide cutting ring itself has been precisely ground to provide the necessary tolerances to minimize total indicator runout. This has been accomplished by grinding the inner surface 22a of the cutting ring which mates with retainer 24. Retainer 24 likewise had to be precisely ground to insure proper centering of the ring. Finally, the flat upper surface and sides of hub 30 had to be ground. With the method and device of the present invention, all of these grinding operations are eliminated and replaced with a single machining step. Thus, cap 32 is actually molded onto hub 30 in a somewhat oversized configuration and is then machined down, for example, by use of a milling head, to the precise configuration as illustrated in FIG. 4. The points of contact for centering of the ring are thus the outermost two perpendicular surfaces 32a and 32b of cap 32 which contact the two perpendicular surfaces formed by the intersection of face 14 and rim 16. Not only is the milling of the epoxy cap 32 much easier and less time consuming than a comparable grinding operation, but by moving the contact points for centering farther away from the center of the ring, greater accuracy can be achieved with the same dimensional tolerances as were previously applied to the inside surface of the ring.

Lip 34 of hub 30 serves as a safety device in that this hardened sintered carbide portion of the ring projects into the resinous cap 32 so as to hold the ring together even though longitudinal cracks may occur in the surface of the cutting ring. It has also been found that cap 32 may be precisely configured to conform to the configuration of face 14 and rim 16 with greater accuracy and reproducibility than was previously the case when the ring had to be ground. Thus, it is possible, utilizing the method and device of the present invention, to interchange the ring 22 on different arbors and to substitute different cutting rings on the same arbor. The fact that the points of contact for centering of the ring relative to the arbor have been moved outwardly from the center point also reduces the impact of any small differences which may occur from one cutting ring to the next or among different arbors.

Because the cap 32 is formed from a relatively soft workable material, it is possible to have a net press fit between the cap and the rim 16 of arbor 12. This is generally not possible where two mating surfaces are formed of hardened sintered carbide. Yet, with a net press fit, that is where the outside diameter of cap 32 is of the same dimension as the inside diameter of rim 16, the assembly is much tighter and the initial T.I.R. is maintained throughout the life of the tool.

Another advantage of the construction of the present invention is that retainer 24 need only be tightened down sufficiently against ring 22 so as to hold the ring in place. With prior art constructions, where the mating surfaces between retainer 24 and ring 22 were actually used to center the ring, it was necessary to tighten the retainer exceedingly tight so as to maintain the centering. In some cases, this would result in distortion of the cutting face.

From the foregoing, it will be apparent that an improved cutter ring for use in trimming printed circuit board leads and a method of forming the ring is presented by the present invention.

I claim:

1. A cutter ring for use in trimming printed circuit board leads and adapted to be held within an arbor by a retainer, said cutter ring comprising:
    a cutter member having a central hub portion surrounding an aperture,
    said cutter member being characterized by being formed from a hardened material which can only be shaped through a prolonged grinding operation; and
    a molded cap formed over said hub portion to present a surface to be received within said arbor,
    said molded cap being characterized by being formed from a relatively workable material which can be shaped through a machining operation,
    whereby said molded cap may be machined to the configuration of said arbor.

2. A cutter ring as set forth in claim 1, wherein said cap extends along the top of said hub portion, down into said aperture and along the side of said hub portion.

3. A cutter ring as set forth in claim 2, wherein said cap is comprised of a resinous material.

4. A cutter ring as set forth in claim 3 wherein said cutter member is comprised of sintered carbide.

5. A cutter assembly for use in trimming printed circuit board leads, said assembly comprising:
    an arbor having a threaded bore and a recessed area for receiving a cutter member;
    a cutter member having a central hub portion surrounding an aperture and being characterized by being formed from a hardened material which can only be shaped through a prolonged grinding operation, said aperture being adapted to be aligned with said threaded bore;
    a molded cap formed over said hub portion to present a surface to be received within said arbor,
    said molded cap being characterized by being formed from a relatively workable material which can be shaped through a machining operation,
    whereby said molded cap may be machined to the configuration of said arbor;
    retainer means received by said cutter member and aligned with said aperture for holding said cutter member within said recessed area; and
    threaded means for engagement with said retainer means and said threaded bore.

6. An assembly as set forth in claim 5, wherein said cap extends along the top of said hub portion, down into said aperture and along the side of said hub portion.

7. An assembly as set forth in claim 6, wherein said cap is comprised of a resinous material.

8. An assembly as set forth in claim 7 wherein said cutter member is comprised of sintered carbide.

9. A method of forming a cutter ring for use in trimming printed circuit board leads wherein the cutter ring is adapted to be held within a recessed arbor face by a retainer, said method comprising the steps of:
    providing a cutter ring blank having a cutting edge, an aperture and a raised central hub, said blank being characterized by being formed from a hardened material which can only be shaped through a prolonged grinding operation;
    molding a cap over said raised central hub, said cap extending across the hub, along the side of the hub and into said aperture, said cap being characterized by being formed from a relatively workable material which can be shaped through a machining operation; and machining said cap to conform the configuration to the configuration of said arbor face.

10. A method as set forth in claim 9 wherein said step of molding a cap comprises molding a cap of resinous material.

11. A method as set forth in claim 9, wherein said step of providing a cutter ring comprises providing a ring of sintered carbide.

* * * * *